United States Patent [19]

Aikens et al.

[11] Patent Number: 5,134,275
[45] Date of Patent: Jul. 28, 1992

[54] SOLID STATE EXPOSUREMETER

[75] Inventors: Richard S. Aikens, Tucson, Ariz.; Wilhelm Pfanhauser, Munich, Fed. Rep. of Germany

[73] Assignee: Photometrics Ltd., Tucson, Ariz.

[21] Appl. No.: 724,709

[22] Filed: Jul. 2, 1991

[51] Int. Cl.[5] .................... G11C 40/34; G11C 19/28; H01L 29/78
[52] U.S. Cl. .................. 250/208.1; 357/24; 377/58; 358/213.19
[58] Field of Search .......... 358/213.19, 213.26, 358/213.31, 213.23; 250/208.1; 357/24 LR, 24 M; 377/58

[56] References Cited

U.S. PATENT DOCUMENTS

| | | | |
|---|---|---|---|
| 4,007,446 | 2/1977 | Elmer et al. | 377/58 X |
| 4,471,228 | 9/1984 | Nishizawa et al. | 250/208.1 X |
| 4,544,848 | 10/1985 | Kawasaki et al. | 358/213.19 X |
| 4,843,474 | 6/1989 | Suzuki | 358/213.19 |
| 4,891,826 | 1/1990 | Yang | 377/58 |

Primary Examiner—Constantine Hannaher
Assistant Examiner—Edward J. Glick
Attorney, Agent, or Firm—Herbert M. Shapiro

[57] ABSTRACT

A Charge-Coupled Device is operable as an exposuremeter during the normal exposure of the parallel register by switching one of the parallel register gates temporarily back and forth between drive circuitry and a sense amplifier. During the exposure of the CCD to photons, the gate potentials are set so that photonic generated charge is stored under one or more phases. An arbitrary gate in the parallel register, designated the sense gate, is disconnected from a normal gate driver and connected to a high input impedance amplifier. The potential on a gate adjacent to the sense gate is changed so that charge is transferred under the sense gate and back again thus producing a voltage transient which is proportional to the total transferred charge.

14 Claims, 2 Drawing Sheets

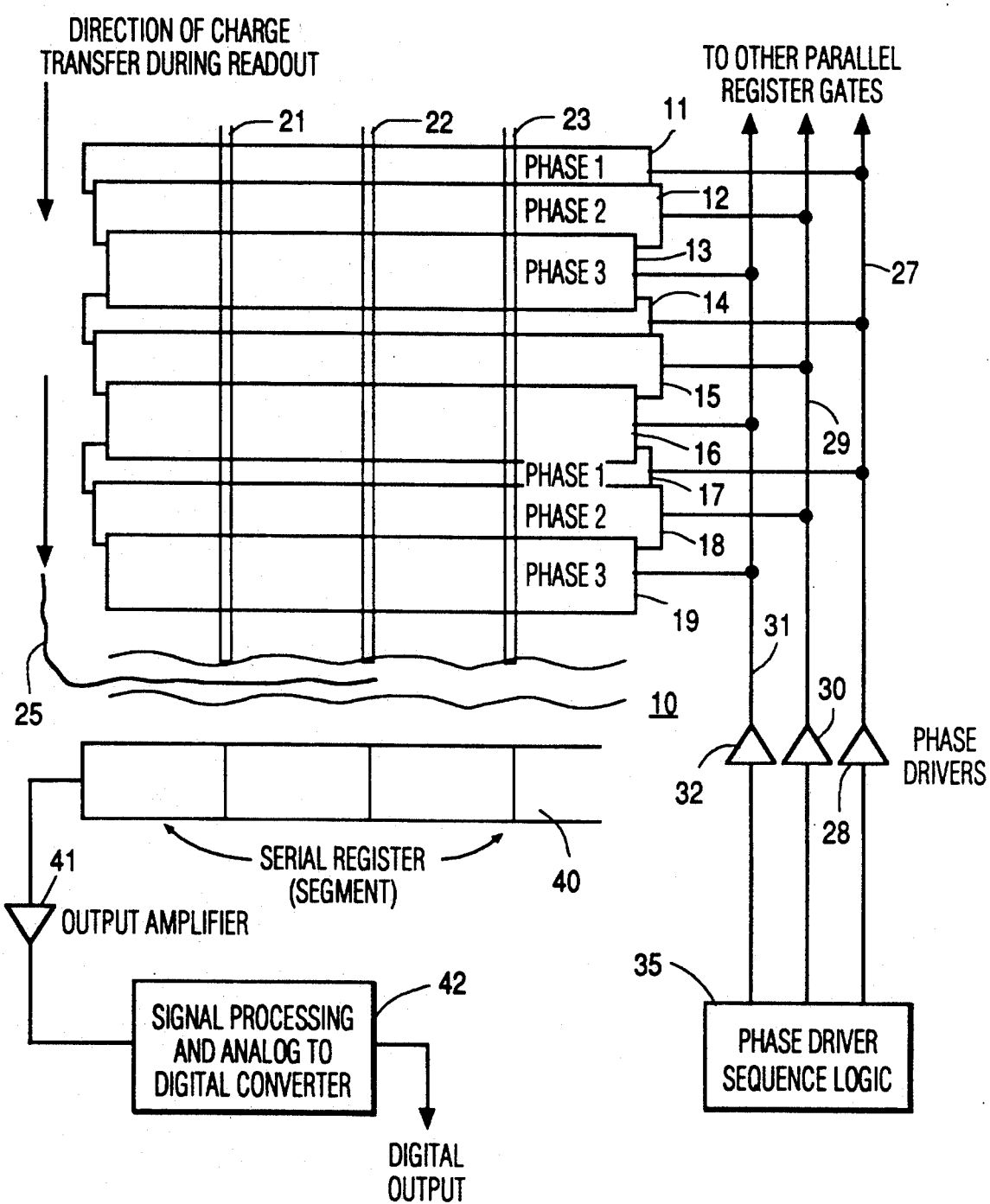

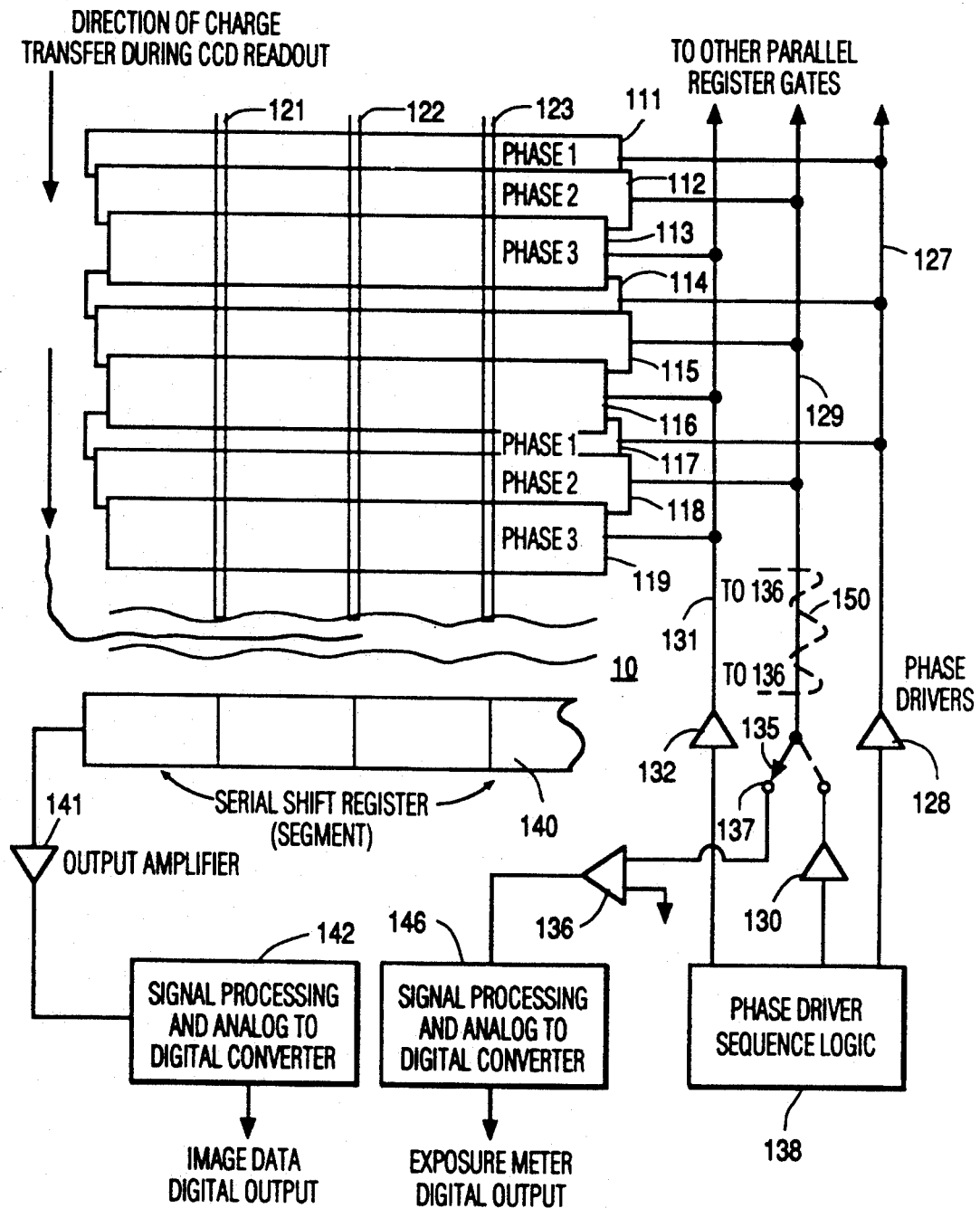

SOLID STATE EXPOSUREMETER

FIELD OF THE INVENTION

This invention relates to solid state devices such as Charge-Coupled Device (CCD's) and, more particularly, to such devices which are useful as exposuremeters.

BACKGROUND OF THE INVENTION

Charge-Coupled Devices are in widespread commercial use and are well understood. A CCD is comprised of a semiconductor substrate in which rows and columns of light sensitive cells (pixels) are defined by photolithographic masking, deposition and diffusion steps. The device includes an overlying multi-phase gate electrode structure operative in response to gate drivers activated by digital clock pulses. In response to the drive pulses, a pattern of charges representative of a light image impinging on the surface of the device, is transferred in parallel rows along columns to a, usually masked, serial register from which successive rows of charges are transferred to an output charge sensitive amplifier for processing. CCDs have utility in television, medical imaging, and a variety of analytical instrument applications including spectroscopy, electrophoresis, electron microscopy, and light microscopy.

BRIEF DESCRIPTION OF THE ILLUSTRATIVE EMBODIMENTS OF THIS INVENTION

In accordance with the principles of this invention, one of the gates of the CCD's multi-phase parallel gate electrode structure, for the purpose of discussion, called the sense gate, is connected to a switch which selectively toggles between a driver and amplifier. For a three-phase or four-phase gate electrode structure, any one of the phases may be so interconnected.

In operation during an exposure of the CCD to photons, the switch is set so that the sense gate is connected to the driver. This action establishes a specific potential on the sense gate. The potential of the gate adjacent to the sense gate, for the purposes of this discussion called the transfer gate, is set to a level so that all the charge from a pixel resides under the transfer gate.

The switch is then moved so as to disconnect the driver from the sense gate which leaves that gate floating at the driver potential. This potential is called the reference signal. The driver on the transfer gate is then programmed to transfer the charge under that gate to a region under the sense gate. This action causes a voltage to be generated at the sense gate which is amplified by an amplifier. The output of the amplifier may be connected to a conventional double correlated sample circuit which produces a signal that is the difference between the reference signal and the voltage generated during the charge transfer. The output of the double correlated sample circut can be used in analog form or digitized by an analog-to-digital converter. The change in voltage at the amplifier output is proportional to the amount of charge transferred and since all the parallel gates of the CCD are connected together, the voltage change represents the total accumulated charge at all the pixel positions (cells) in the CCD. After the amplifier output has been measured by analog or digital means, the transfer gate is programmed to transfer the charge away from the sense gate back under the transfer gate and the switch is set to connect the sense gate back to the driver which re-establishes the original driver potential on the sense gate.

The process can be carried on in a repetitive fashion thus allowing measurement of charge which accumulates in the parallel imaging register during the entire exposure.

In one instance, the amplifier output can be used for comparison with a reference exposure for controlling an x-ray source impinging on a fluorescent screen originating the light image directed at the CCD. In practice after the conclusion of an exposure, the CCD is operative in conventional fashion to move successive rows of charges to a serial register for normal CCD image readout.

During an exposure, the serial register itself may serve as an indicator for determining the amount of light impinging on the CCD. The use of the serial register to monitor the accumulation of charge during an exposure is described in co-pending application Ser. No. 633212 filed Dec. 21, 1990, and assigned to the assignee of the present application.

BRIEF DESCRIPTION OF THE DRAWINGS

FIG. 1 is a schematic top view of a segment of a prior art three phase, Charge-Coupled Device showing a conventional electronic drive arrangement; and FIG. 2 is a schematic top view of a segment of a Charge-Coupled Device with an electronic drive arrangement operative as an exposuremeter in accordance with the principles of this invention.

DETAILED DESCRIPTION OF AN ILLUSTRATIVE EMBODIMENT OF THIS INVENTION

FIG. 1 is a schematic top view of a segment 10 of a prior art Charge-Coupled Device (CCD). The device comprises a semiconductor substrate with a polysilicon, multi-phase gate electrode structure overlying the substrate. The gate structure is shown as a three-phase structure, conductive elements being designated 11, 12, and 13; 14, 15, and 16; and 17, 18, and 19 for the segment shown. Elements 11, 14, and 17 are connected in parallel to form the first-phase for sensors in a column; elements 12, 15, and 18 and elements 13, 16, and 19 form the second and third-phase. The pixels of a column are separated by channel stops 21, 22, and 23. The semiconductor substrate is designated 25.

The first phase elements of the gate structure, 11, 14, and 17, are connected to the conductor 27 which, in turn, is connected to the output of driver 28. Similarly, the second and third-phase elements of the gate structure 12, 15, and 18 and 13, 16, and 19, respectively, are connected to conductors 29 and 31. Conductors 29 and 31, in turn, are connected to outputs of drivers 30 and 32, respectively. Drivers 28, 30, and 32 are activated under the action of controller 35, including driver sequence logic, to move charge in the sensors of the sensor array defined in the substrate, downward, as viewed, in conventional fashion. Charge movement in the various columns or channels can thus be synchronized by the gate structure. Each cycle of operation moves the corresponding charge in the channels to the lowest position in the channel. A serial shift register 40 is defined in a position to accept the consecutive charges from the set of lowest positions and move the charges illustratively to the left as viewed. In this manner, consecutive charge levels represent the intensities of an incident light image on the respective sensors (cells) of the CCD. The output of the shift register is applied to the input of amplifier 41, the output of which is connected to the input of analog processor and analog to digital converter 42. The output of 42 is a sequence of digital values representative of the intensity of incident radiation at the address of the respective cell during an exposure portion of a cycle of operation. Typically, shift register 40 is coated with an opaque coating and is operative between exposure times to move the charge as described.

The CCD cannot be operated to provide an overall measure of incident light intensity during an exposure period. FIG. 2 shows a CCD with an electronic arrangement which does permit the CCD to be operated in a manner to provide a reading of the total accumulation of charge in the CCD prior to read out as described above.

The normal use of a CCD is as an imaging device. The normal operation can be viewed as two distinct operations. The first is the exposure of the imaging portion of the CCD, hereinafter referred to as the parallel register, to photonic input and the collection of photon-generated electronic charge at the pixel (cell) sites. The second is the readout and subsequent measurement of the acquired electronic charge which takes place in serial fashion via shift register 40.

During exposure of the parallel register, it is desirable to know how much charge has accumulated in order to be certain that an anticipated signal level has been achieved or to terminate an exposure prior to saturation of the CCD. The electronic arrangement of FIG. 2 permits the average charge level in the parallel register to be determined during the exposure and the acquisition of an electronic image.

Specifically, the parallel register of FIG. 2 includes two or more (illustratively three) gates per row operative in conventional fashion to confine the electronic charge to a pixel site in proportion to the number of photons incident during that exposure. Normally, all the gates of the parallel register are connected to clock drivers, as shown in FIG. 1. The drivers generate potential either to hold charge within the cells of a row during exposure or to shift charge from the row of cells to shift register 40 of FIG. 1 during readout after exposure is terminated.

The arrangement of FIG. 2 is operative to move charge packets within the cells of a row from positions in registry with a first of the phase elements of the gate structure to another of the phase elements while still confining the charge to the cells of the row. The arrangement also permits a second one of the phase elements of the gate structure to operate as a sensor to measure the total charge of all sensors in the parallel register as that charge is moved under that second one.

In this context, attention is directed to FIG. 2 in connection with which a description of a CCD with an electronic arrangement for operation in accordance with the principle of this invention is rendered.

Specifically, FIG. 2 shows a segment 110 of a CCD sensor array. Charges, as in the prior art arrangement of FIG. 1, are moved in channels by a three-phase gate structure including conductor elements 111, 112, and 113; 114, 115, and 116; and 117, 118, and 119. Elements 111, 114, and 117 are connected electrically in parallel to form the first-phase of the gate series. Similarly, elements 112, 115, and 118 and elements 113, 116, and 119 are connected to form the second and third-phase, respectively, in the series. The channels are separated by channel stops 121, 122, and 123 so that charges moved in the channels by the three-phase gate structure remain separated. The first and third-phase elements of the gate are connected between ground (not shown) and the outputs of drivers 128 and 132 via representative lines 127 and 131 respectively.

But, in accordance with the principles of this invention, elements 112, 115, and 118 of the second-phase of the gate structure are not connected directly to the output of driver 130. Instead, the second-phase gate is connected to a switch represented by wiper 135 via representative line 129. The switch connects the second-phase gate to the output driver 130 or to the input of amplifier 136 via contact 137 under the control of a controller represented by block 138. The output of amplifier 136 is connected to the input of signal processor and analog to digital converter 146.

The CCD arrangement of FIG. 2 is operative in normal fashion to move charges downward for movement to shift register 140. The output of the shift register is connected to the input of an amplifier 141. The output of amplifier 141 is connected to the input of a signal processor and analog to digital (A/D) converter 142 to provide digital numbers representative of the magnitude of the pixel values from the serial register.

But, the CCD arrangement of FIG. 2 also has another mode of operation because of switch 135. specifically, during the exposure phase of operation, one of the gates (i.e. the phase-two gate) is operative as a capacitive sensor. Operation in this mode commences when the phase-two gate is reset to a potential which creates a barrier to the movement of charge from under the phase-one gate. The phase one gate potential is then changed to cause the charge to transfer under gate two, thus, causing a change in the phase-two gate potential. The amount of potential change on phase two gate is equal to the quantity of charge which shifts under the phase-two gate divided by the total capacitance associated with the phase-two gate. Because all the gate elements, on the parallel register, of the same phase are connected in parallel, the potential generated at the phase-two gate is proportional to the net charge in the entire parallel register.

This charge is shifted back and forth between the gate two and the gate one elements by changes in potentials on gate one. In this manner, a measurement is provided of the accumulation of electronic charge in the parallel register, during the exposure, without interfering with the normal exposure and charge accumulation process. The measurement of that net charge is made by operating the switch (135 of FIG. 2) to connect phase two gate to the input of amplifier 136. When charge from the phase one gate is transferred under phase two gate, A/D converter 146 provides a digital number representative of the level of exposure of the entire CCD. Thus, by applying a set of programmed potentials, the charges in all the channels in the parallel register move back and forth, within pixel positions, in a manner to permit the measurement of the total accumulated charge in the parallel register during normal operation of that register. A highly accurate and timely measure of incident light is provided in this manner.

A CCD arrangement in accordance with the principles of this invention is useful in x-ray exposure systems, for example. In such systems, the x-ray image is converted to a light image by a fluorescent screen and the light image from the screen is incident on the CCD. Thus, the net accumulated charge on the CCD during an exposure phase of a cycle of operation is a measure of the intensity of the x-ray exposure. In copending application, Ser. No. 633212 filed Dec. 21, 1990 and assigned to the assignee of the instant application, an x-ray system is described in which the system is focused onto a small area of the original field of exposure. The system is operative to reduce the x-ray exposure level by an amount which is proportional to the reduced area of attention so that the x-ray density over the reduced area of interest is equal to that over the original field of interest.

The invention has been described in terms of charge being shuttled between a phase-two and phase-one gate. In this case, the phase-two gate is the "sense" gate. It should be understood that any phase gate may be used as the sense gate in which case, that gate is connected by a switch 135 controllably to the associated driver or to an amplifier 136. Further, instead of switch (135) of FIG. 2, an impedance 150 (shown dotted in FIG. 2) may be included in the sense gate phase line. The amplifier (136) is connected across the impedance to respond as decribed above.

Also, the invention has been described in terms of a CCD. Other solid state sensor arrays such as charge injection devices (CID's) can be used similarly.

What is claimed is:

1. Apparatus comprising a solid state device in which charge is accumulated in an array of pixel positions and moved along channels by a plurality of gates operative in a multi-phase manner, each of said gates being connected to an associated driver for applying a first multi-phase pattern of potentials to said gates, means connected to a selected one of said gates for connecting said selected one of said gates to a sensing means, and control means connected to said drivers for changing the potentials applied by said drivers to a second pattern for moving said charge to an adjacent gate and back again while said selected one of said gates is connected to said sensing means.

2. Apparatus as set forth in claim 1 wherein said means for connecting includes means for disconnecting the associated driver.

3. Apparatus as set forth in claim 2 wherein said second pattern comprises a sequence of potentials for moving said charge to the next or preceding gate.

4. Apparatus as set forth in claim 2 wherein said sensing means includes an amplifier, said amplifier being connected to a first analog to digital converter for providing a digital representation of exposure of said device during an exposure phase of operation.

5. Apparatus as set forth in claim 4 also including a serial shift register and means for shifting charge from said channels to associated cells of said serial shift register during a non-exposure phase of operation, said serial shift register being connected to a second analog to digital converter to provide digital representations of the magnitude of said charge.

6. Apparatus as set forth in claim 3 wherein said second pattern is repetitive.

7. Apparatus as set forth in claim 5 wherein said second pattern is repetitive.

8. Apparatus as set forth in claim 1 wherein said solid state device is a Charge-Coupled Device.

9. Apparatus as set forth in claim 5 wherein said solid state device is a Charge-Coupled Device.

10. Apparatus as set forth in claim 9 wherein said means connected to a selected one of said gates includes a switch.

11. Apparatus as set forth in claim 5 wherein said plurality of gates is operative in a three phase manner.

12. Apparatus as set forth in claim 3 wherein said solid state device is a charge injection device.

13. Apparatus as set forth in claim 1 wherein said means connected to a selected one of said gates comprises a resistor, said sensing means being connected across said resistor.

14. Apparatus as set forth in claim 1 wherein said sensing means includes an amplifier.

* * * * *